United States Patent
Kim et al.

(10) Patent No.: US 11,818,881 B2
(45) Date of Patent: Nov. 14, 2023

(54) SUB WORD-LINE DRIVER CIRCUIT OF SEMICONDUCTOR MEMORY DEVICE AND SEMICONDUCTOR MEMORY DEVICE INCLUDING THE SAME

(71) Applicant: SAMSUNG ELECTRONICS CO., LTD., Suwon-si (KR)

(72) Inventors: Kyoungmin Kim, Namyangju-si (KR); Donggeon Kim, Suwon-si (KR); Myeongsik Ryu, Anyang-si (KR); Sangwook Park, Hwaseong-si (KR); Inseok Baek, Suwon-si (KR); Bokyeon Won, Namyangju-si (KR)

(73) Assignee: Samsung Electronics Co., Ltd.

( * ) Notice: Subject to any disclaimer, the term of this patent is extended or adjusted under 35 U.S.C. 154(b) by 16 days.

(21) Appl. No.: 17/709,971

(22) Filed: Mar. 31, 2022

(65) Prior Publication Data

US 2023/0130345 A1    Apr. 27, 2023

(30) Foreign Application Priority Data

Oct. 27, 2021    (KR) .................. 10-2021-0144382

(51) Int. Cl.

| | |
|---|---|
| *G11C 11/40* | (2006.01) |
| *H10B 12/00* | (2023.01) |
| *H01L 25/065* | (2023.01) |
| *G11C 11/408* | (2006.01) |
| *H01L 29/423* | (2006.01) |
| *H01L 23/498* | (2006.01) |

(52) U.S. Cl.
CPC .......... *H10B 12/50* (2023.02); *G11C 11/4085* (2013.01); *H01L 25/0652* (2013.01); *H01L 29/4238* (2013.01); *H01L 23/49816* (2013.01); *H01L 23/49833* (2013.01); *H01L 2225/06513* (2013.01); *H01L 2225/06541* (2013.01)

(58) Field of Classification Search
None
See application file for complete search history.

(56) References Cited

U.S. PATENT DOCUMENTS

| | | | |
|---|---|---|---|
| 7,480,168 B2 | 1/2009 | Arimoto et al. | |
| 7,729,195 B2 | 6/2010 | Youn et al. | |
| 9,620,175 B2 | 4/2017 | Takahashi | |
| 10,892,004 B2 | 1/2021 | Jeong | |
| 2009/0034353 A1 | 2/2009 | Narui et al. | |
| 2019/0189186 A1* | 6/2019 | Won | H01L 27/0207 |

\* cited by examiner

*Primary Examiner* — Tan T. Nguyen
(74) *Attorney, Agent, or Firm* — Fish & Richardson P.C.

(57) ABSTRACT

A sub word-line driver circuit of a semiconductor memory device includes a first active pattern and a second active pattern in a substrate, and a gate pattern. The first active pattern includes a first drain region and a first source region of a first keeping transistor that precharges a first word-line which is inactive and extends in a first direction with a negative voltage. The second active pattern includes a second drain region and a second source region of a second keeping transistor that precharges a second word-line which is inactive and extends in the first direction with the negative voltage. The gate pattern is on a portion of the first active pattern and on a portion of the second active pattern, partially overlaps the first active pattern and the second active pattern.

20 Claims, 15 Drawing Sheets

SUB WORD-LINE DRIVER CIRCUIT OF SEMICONDUCTOR MEMORY DEVICE AND SEMICONDUCTOR MEMORY DEVICE INCLUDING THE SAME

CROSS-REFERENCE TO RELATED APPLICATIONS

A claim of priority under 35 USC § 119 is made to Korean Patent Application No. 10-2021-0144382, filed on Oct. 27, 2021 in the Korean Intellectual Property Office, the entirety of which is hereby incorporated by reference.

BACKGROUND

The present disclosure relates to memories, and more particularly to sub word-line driver circuits that drive word-lines and semiconductor memory devices including the same.

The capacity and speed of semiconductor memory devices used in various electronic systems have recently increased based on user demand for high performance. A dynamic random access memory (DRAM) is a typical example of a volatile memory device. A memory cell of a DRAM stores data in the form of charges in a cell capacitor. Data is written into or read out of memory cells of a DRAM by using a word-line and a bit line. Memory cells connected to a word line may constitute one row, and may operate based on a voltage applied to a word-line.

However, as the capacity of a DRAM is increased, the number of memory cells connected to one word-line may increase, and a distance (or a cell pitch) between word-lines may shrink. In the case where a word-line voltage is applied to a word-line connected with such an increased number of memory cells, delay may become an issue of concern. To mitigate the delay on the word line voltage, a technique to divide one word line into a plurality of sub-word lines and drive each sub-word line by using sub-word line drivers may be used.

SUMMARY

Embodiments of the inventive concepts may provide a sub word-line driver circuit of a semiconductor memory device, and a semiconductor memory device including a sub word-line driver circuit, capable of enhanced performance.

Embodiments of the inventive concepts provide a semiconductor memory device including a first sub word-line driver and a second sub word-line driver. The first sub word-line driver includes a first transistor that supplies a negative voltage to a first word-line extending in a first direction in response to a driving signal. The second sub word-line driver includes a second transistor that supplies the negative voltage to a second word-line extending in the first direction in response to the driving signal. The first transistor and the second transistor include a first active pattern, a second active pattern and a gate pattern. The first active pattern extends in a second direction crossing the first direction and is connected with the first word-line through a first direct contact. The second active pattern extends in the second direction, is spaced apart from the first active pattern in the second direction by a first gap and is connected with the second word-line through a second direct contact. The gate pattern is on a portion of the first active pattern and on a portion of the second active pattern such that the gate pattern partially overlaps the first active pattern and the second active pattern. The first active pattern is connected with a third direct contact that does not overlap the gate pattern and that supplies the negative voltage. The second active pattern is connected with a fourth direct contact that does not overlap the gate pattern and that supplies the negative voltage.

Embodiments of the inventive concepts further provide a sub word-line driver circuit of a semiconductor memory device. The sub word-line driver circuit includes a first active pattern, a second active pattern and a gate pattern. The first active pattern is in a substrate, and includes a first drain region and a first source region of a first transistor that precharges a first word-line which is inactive and extends in a first direction with a negative voltage. The second active pattern is in the substrate, and includes a second drain region and a second source region of a second transistor that precharges a second word-line which is inactive and extends in the first direction with the negative voltage. The gate pattern is on a portion of the first active pattern and on a portion of the second active pattern, and partially overlaps the first active pattern and the second active pattern.

Embodiments of the inventive concepts still further provide a semiconductor memory device including a first sub word-line driver that drives a first word-line extending in a first direction, and a second sub word-line driver that drives a second word-line extending in the first direction. The first sub word-line driver includes a first transistor that precharges the first word-line with a negative voltage in response to a driving signal. The second sub word-line driver includes a second transistor that precharges the second word-line with the negative voltage in response to the driving signal. The first transistor and the second transistor include a first active pattern, a second active pattern and a gate pattern. The first active pattern extends in a second direction crossing the first direction and is connected with the first word-line through a first direct contact. The second active pattern extends in the second direction, is spaced apart from the first active pattern in the second direction by a first gap and is connected with the second word-line through a second direct contact. The gate pattern is on a portion of the first active pattern and a portion of the second active pattern, and partially overlaps the first active pattern and the second active pattern.

Accordingly, the first keeping transistor and the second keeping transistor share the gate pattern but include respective source regions separated by a device isolation region. Accordingly, interference between word-lines due to short-circuit phenomenon under the gate pattern may be prevented and a gap between the source region in the second direction may be reduced compared with a structure in which source regions of the first and second keeping transistors are merged.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
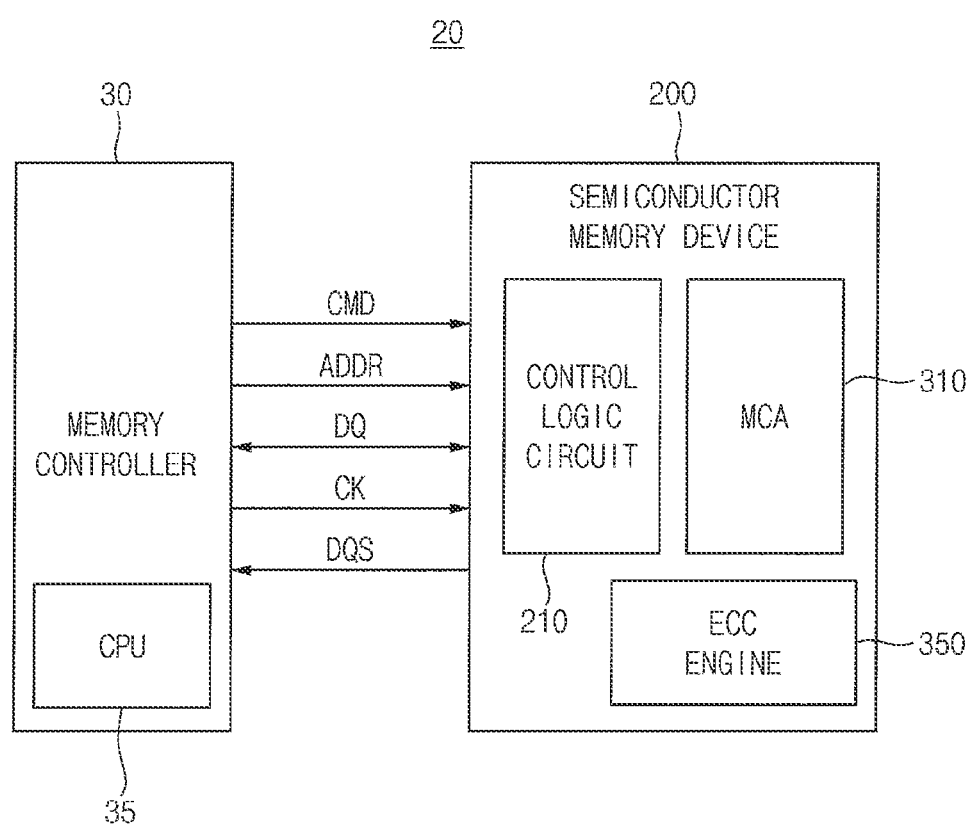
FIG. 1 illustrates a block diagram of a memory system according to embodiments of the inventive concepts.

FIG. 1 illustrates a block diagram of a memory system according to embodiments of the inventive concepts.

Referring to FIG. 1, a memory system 20 may include a memory controller 30 and a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as dynamic random access memory (DRAM), double data rate 5 (DDR5) synchronous DRAM (SDRAM), or DDR6 SDRAM.

The memory controller 30 transmits a clock signal CK (the clock signal CK may be referred to a command clock signal), a command CMD, and an address (signal) ADDR to the semiconductor memory device 200. The memory controller 30 may receive a data strobe signal DQS from the semiconductor memory device 200 when the memory controller 30 reads data signal DQ from the semiconductor memory device 200. The address ADDR may be accompanied by the command CMD and the address ADDR may be referred to as an access address.

The memory controller 30 may include a central processing unit (CPU) 35 that controls overall operation of the memory controller 30.

The semiconductor memory device 200 may include a memory cell array (MCA) 310 that stores the data signal DQ, a control logic circuit 210 and an error correction code (ECC) engine 350.

The control logic circuit 210 may control operations of the semiconductor memory device 200. The memory cell array 310 may include a plurality of memory cell rows and each of the memory cell rows may include a plurality of volatile memory cells.

The ECC engine 350 may perform an ECC decoding operation on write data to be stored in a target page of the memory cell array 310 to generate parity data, and may perform an ECC decoding operation on data and parity data read from the target page to correct an error in read data.

Figure 2:
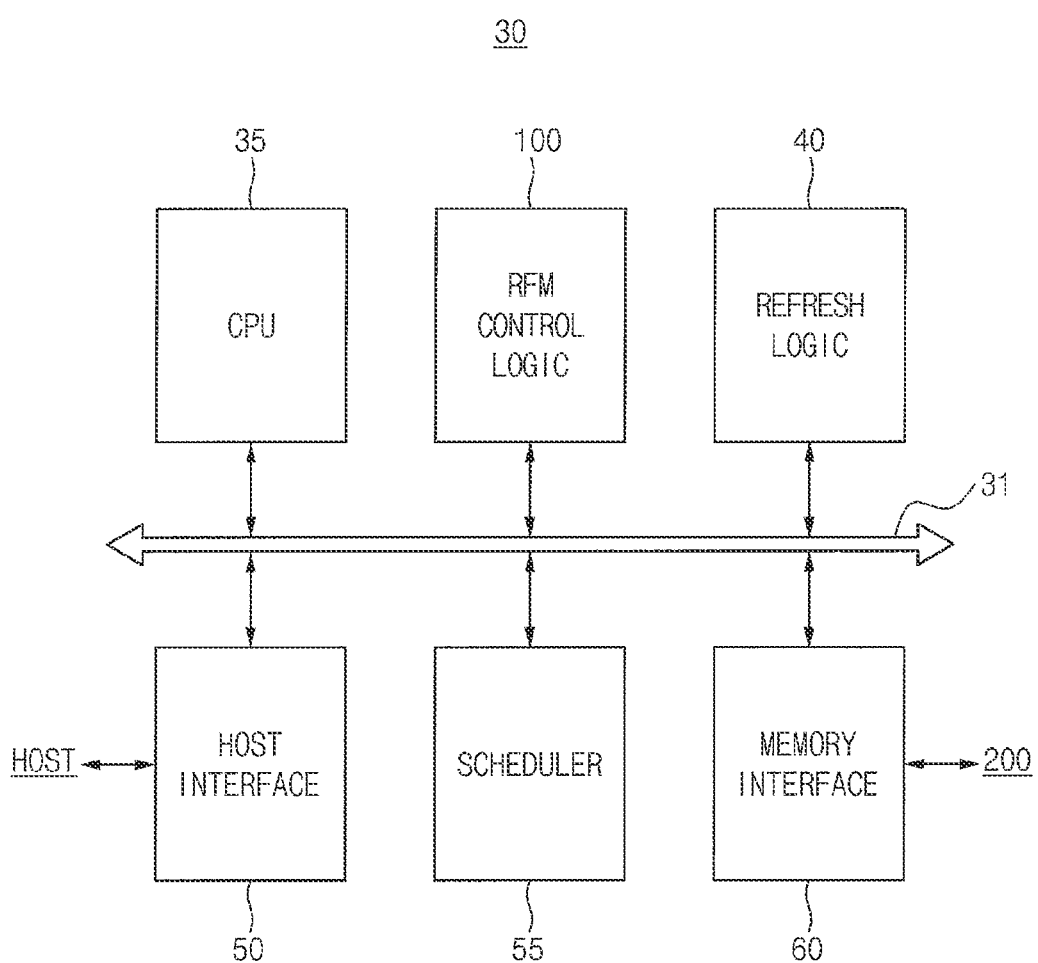
FIG. 2 illustrates a block diagram of the memory controller in FIG. 1 according to embodiments of the inventive concepts.

FIG. 2 illustrates a block diagram of the memory controller in FIG. 1 according to embodiments of the inventive concepts.

Referring to FIG. 2, the memory controller 30 may include the CPU 35, a refresh management (RFM) control logic 100 (e.g., an RFM control logic circuit), a refresh logic 40 (e.g., a refresh logic circuit), a host interface 50, a scheduler 55 and a memory interface 60 which are connected to each other through a bus 31.

The CPU 35 may control overall operation of the memory controller 30. The CPU 35 may control the RFM control logic 100, the refresh logic 40, the host interface 50, the scheduler 55 and the memory interface 60.

The refresh logic 40 may generate an auto refresh command for refreshing the plurality of memory cell rows based on a refresh interval of the semiconductor memory device 200.

The RFM control logic 100 may generate a RFM command associated with a row hammer of the plurality of memory cell rows. For example, repeated access within a time window of a specific row may be characterized as a row hammer (which may also be referred to as a row hammer event, a row hammer condition or as hammering).

The host interface 50 may perform interfacing with a host (not shown). The memory interface 60 may perform interfacing with the semiconductor memory device 200.

The scheduler 55 may manage scheduling and transmission of sequences of commands generated in the memory controller 30. The scheduler 55 may transmit the active command and subsequent commands to the semiconductor memory device 200 via the memory interface 60.

The semiconductor memory device 200 performs a refresh operation periodically due to charge leakage of memory cells storing data. Due to scaling down of the manufacturing process of the semiconductor memory device 200, the storage capacitance of the memory cell is decreased and the refresh period is shortened. The refresh period is further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme is developed to reduce the burden of the memory controller. The memory controller is totally responsible for the hammer refresh operation in the TRR scheme and the semiconductor memory device is totally responsible for the hammer refresh operation in the in-memory refresh scheme.

Figure 3:
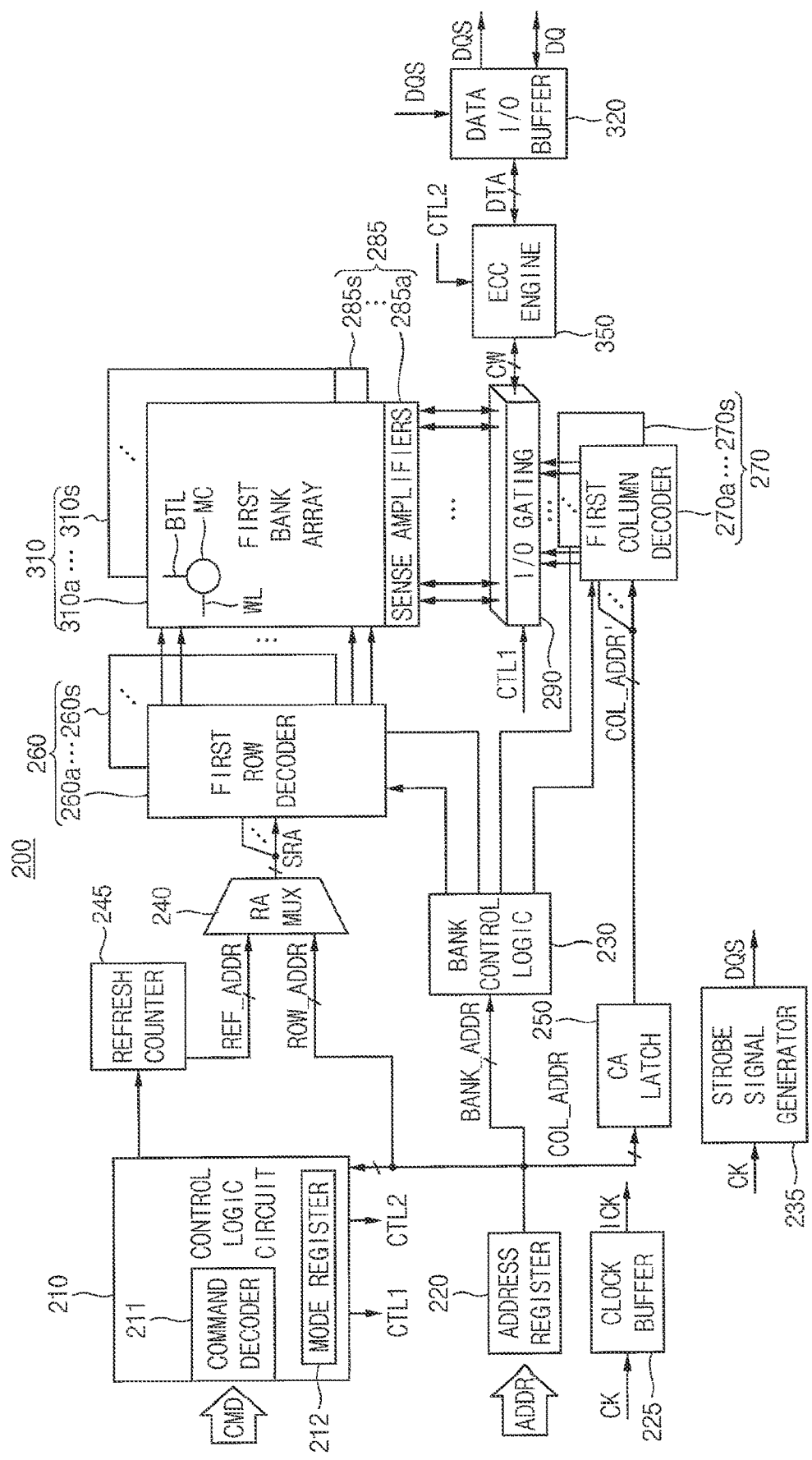
FIG. 3 illustrates a block diagram of an example of the semiconductor memory device in FIG. 1 according to embodiments of the inventive concepts.

FIG. 3 illustrates a block diagram of an example of the semiconductor memory device in FIG. 1 according to embodiments of the inventive concepts.

Referring to FIG. 3, the semiconductor memory device 200 may include the control logic circuit 210, an address register 220, a bank control logic 230 (e.g., a bank control logic circuit), a refresh counter 245, a row address multiplexer (RA MUX) 240, a column address (CA) latch 250, a row decoder 260, a column decoder 270, the memory cell array 310, a sense amplifier unit 285, an I/O gating circuit 290, the ECC engine 350, a clock buffer 225, a strobe signal generator 235 and a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifiers 285a~285s respectively coupled to the first through sixteenth bank arrays 310a~310s. In other example embodiments, any number of bank arrays, row decoders, column decoders and sense amplifiers may be included.

The first through sixteenth bank arrays 310a~310s, the first through sixteenth row decoders 260a~260s, the first through sixteenth column decoders 270a~270s and first through sixteenth sense amplifiers 285a~285s may form first through sixteenth banks. Each of the first through sixteenth bank arrays 310a~310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260s.

The refresh counter 245 may sequentially increase or decrease the refresh row address REF_ADDR in a normal refresh mode under control of the control logic circuit 210.

The activated one of the first through sixteenth row decoders 260a~260s, activated by the bank control logic 230, may decode the row address SRA that is output from the row address multiplexer 240, and may activate a word-line corresponding to the row address SRA. For example, the activated row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that increments from the received column address COL_ADDR. The column address latch 250 may apply the temporarily stored or generated column address COL_ADDR' to the first through sixteenth column decoders 270a~270s.

The activated one of the first through sixteenth column decoders 270a~270s activates a sense amplifier corresponding to the bank address BANK_ADDR and the column address COL_ADDR through the I/O gating circuit 290.

The I/O gating circuit 290 may include circuitry for gating input/output data, and may further include input data mask logic, read data latches for storing data that is output from the first through sixteenth bank arrays 310a~310s, and write drivers for writing data to the first through sixteenth bank arrays 310a~310s.

Codeword CW read from one bank array of the first through sixteenth bank arrays 310a~310s is sensed by a sense amplifier coupled to the one bank array from which the data is to be read, and is stored in the read data latches of the I/O gating circuit 290. The codeword CW stored in the read data latches may be provided to the data I/O buffer 320 as data DTA after ECC decoding is performed on the codeword CW by the ECC engine 350. The data I/O buffer 320 may convert the data DTA into the data signal DQ and may transmit the data signal DQ along with the data strobe signal DQS to the memory controller 30.

On the other hand, the data signal DQ to be written in one bank array of the first through sixteenth bank arrays 310a~310s may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity data (bits), and the ECC engine 350 may provide the codeword CW including data DTA and the parity bits to the I/O gating circuit 290. The I/O gating circuit 290 may write the codeword CW in a sub-page in one bank array through the write drivers.

The data I/O buffer 320 may provide the data signal DQ from the memory controller 30 to the ECC engine 350 by converting the data signal DQ to the data DTA in a write operation of the semiconductor memory device 200, and may convert the data DTA from the ECC engine 350 to the data signal DQ and may transmit the data signal DQ and the data strobe signal DQS to the memory controller 30 in a read operation of the semiconductor memory device 200.

The ECC engine 350 may perform an ECC encoding (operation) and an ECC decoding (operation) on the data DTA based on a second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the data I/O buffer 320.

The control logic circuit 210 may control operations of the semiconductor memory device 200. For example, the control logic circuit 210 may generate control signals for the semiconductor memory device 200 in order to perform a write operation, a read operation and a refresh operation. The control logic circuit 210 may include a command decoder 211 that decodes the command CMD received from the memory controller 30, and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 for controlling the I/O gating circuit 290 and the second control signal CTL2 for controlling the ECC engine 350.

Figure 4:
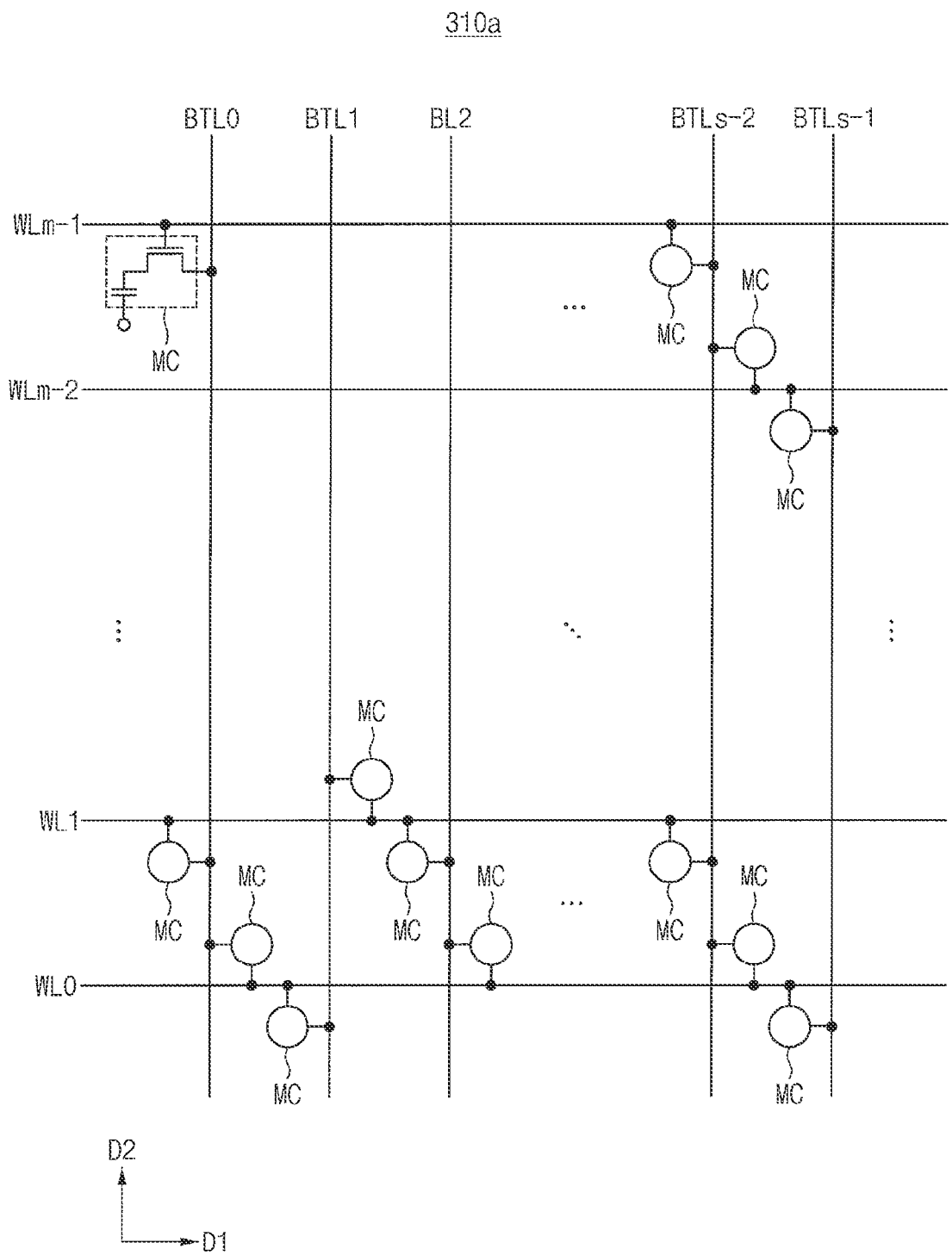
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310a includes a plurality of word-lines WL0~WLm-1 (m is a natural number greater than two), a plurality of bit-lines BTL0~BTLs-1 (s is a natural number greater than two), and a plurality of volatile memory cells MCs disposed at intersections between the word-lines WL0~WLm-1 and the bit-lines BTL0~BTLs-1. Each of the memory cells MCs includes a cell transistor coupled to a corresponding word line from among the word-lines WL0~WLm-1 and a corresponding bit line from among the bit-lines BTL0~BTLs-1, and a cell capacitor coupled to the cell transistor. Each of the memory cells MCs may have a DRAM cell structure. The word-lines WL0~WLm-1 extend in a first direction D1 and the bit-lines BTL1~BTLs extend in a second direction D2 crossing the first direction D1. The other bank arrays may be configured in a similar manner.

The word-lines WL0~WLm-1 coupled to the a plurality of memory cells MCs may be referred to as rows of the first bank array 310a and the bit-lines BTL0~BTLs-1 coupled to the a plurality of memory cells MCs may be referred to as columns of the first bank array 310a.

Figure 5:
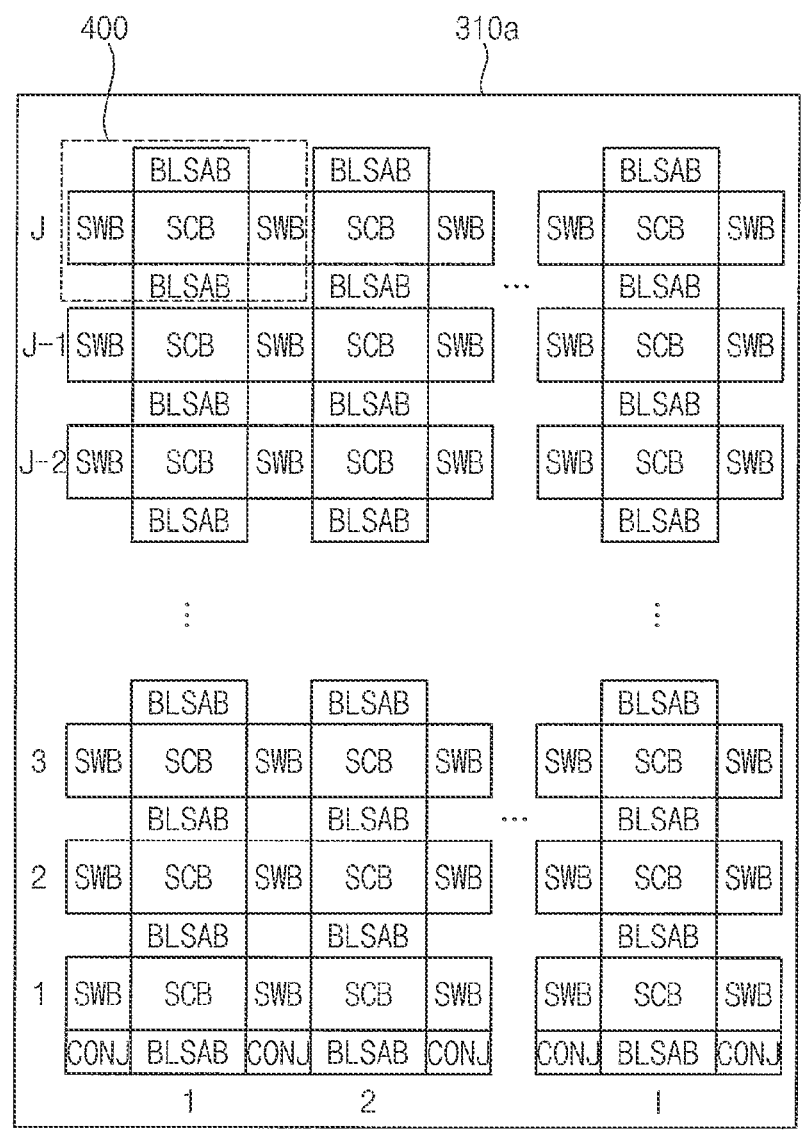
FIG. 5 illustrates an example of the first bank array in the semiconductor memory device of FIG. 3 according to embodiments of the inventive concepts.

FIG. 5 illustrates an example of the first bank array in the semiconductor memory device of FIG. 3 according to some embodiments of the inventive concepts.

Referring to FIG. 5, in the first bank array 310 (i.e., 310a in FIG. 3), I sub-array blocks SCB may be disposed in the first direction D1, and J sub-array blocks SCB may be disposed in the second direction D2 substantially perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. Although not specifically shown in FIG. 5, a plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLS AB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator (not shown) is disposed in each of the conjunction regions CONJ. A portion 400 in the first bank array 310 may be described with reference to FIG. 6 hereinafter.

Figure 6:
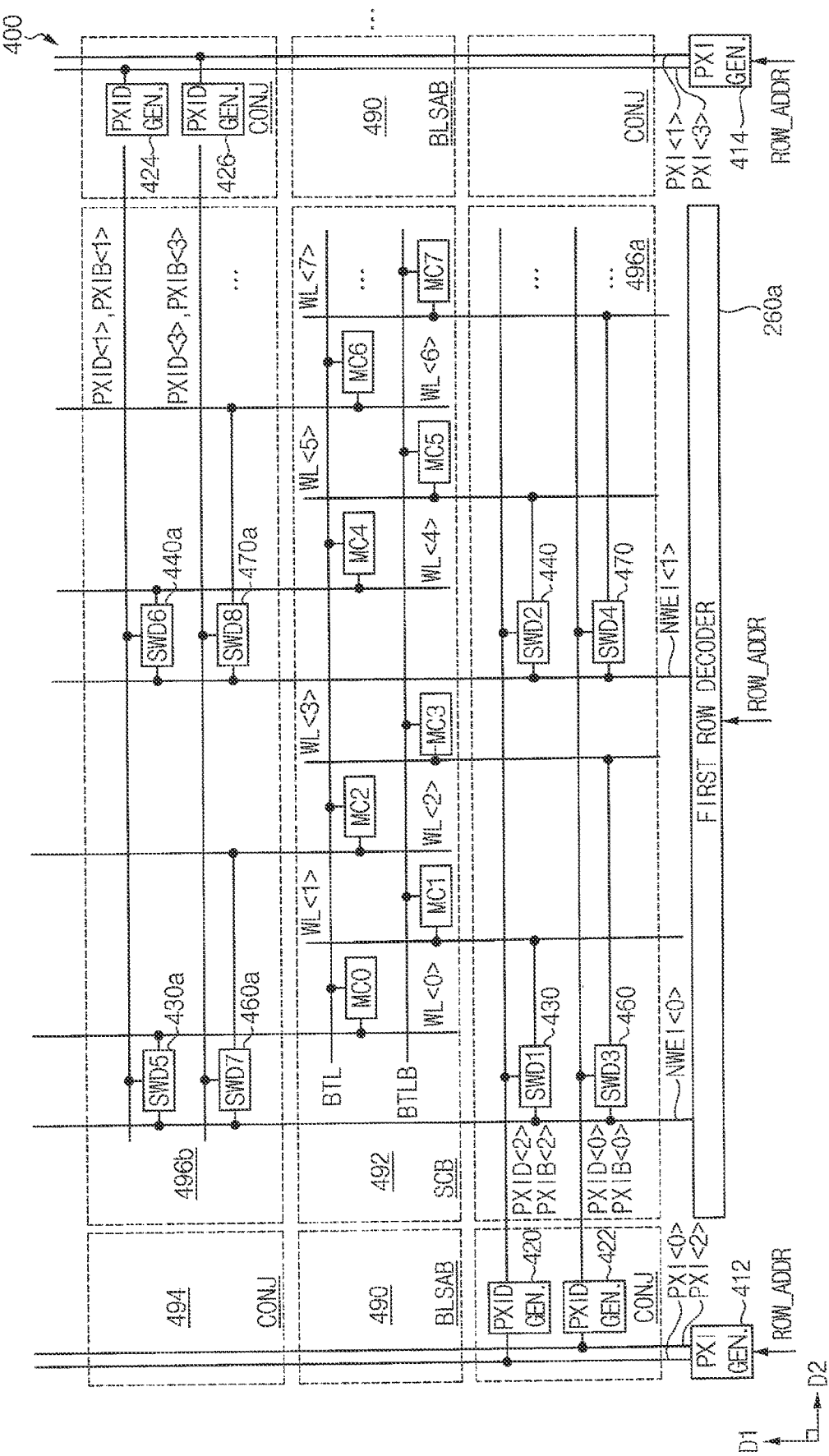
FIG. 6 illustrates a portion of the first bank array in FIG. 5 according to embodiments of the inventive concepts.

FIG. 6 illustrates a portion of the first bank array in FIG. 5 according to some embodiments of the inventive concepts.

In FIG. 6, the first row decoder 260a and pre-decoders 412 and 414 are illustrated together for convenience of explanation.

Referring to FIGS. 5 and 6, in the portion 400 of the first bank array 310, the sub-array block SCB 492, the bit-line sense amplifier regions 490, the sub word-line driver regions 496a and 496b, and the conjunction regions CONJ 494 are disposed.

A plurality of driving voltage generators (PXID GEN.) 420, 422, 424, and 426 may be disposed in the conjunction regions CONJ.

A plurality of sub word-line drivers (SWD1~SWD4) 430, 440, 460, and 470 may be disposed in the sub word-line driver region 496a and a plurality of sub word-line drivers (SWD5~SWD8) 430a, 440a, 460a, and 470a may be disposed in the sub word-line driver region 496b.

The row decoder 260a may select a word-line of a memory cell to be accessed, in response to an input row address (ROW_ADDR) RA. The row decoder 260a may decode the input row address RA to generate word-line enable signals NWEI<n> (n being an integer more than "0") for enabling a corresponding word-line.

The word-line enable signals NWEI<n> of the row decoder 260a may be activated in a write operation mode and a read operation mode associated with selected memory cells. Also, in a self-refresh operation mode, the row decoder 260*a* may decode a row address ROW_ADDR generated from the refresh counter 245 and may enable a corresponding word line.

The pre-decoders 412 and 414 may generate pre-decoding signals PXI<0>, PXI<1>, PXI<2>, PXI<3>, etc. in response to the row address ROW_ADDR. For example, the pre-decoders 412 and 414 may decode lower bits of the row address ROW_ADDR to generate pre-decoding signals PXI<j> (j being an integer more than "0") corresponding to a selected word-line. The pre-decoding signals PXI<j> may be transmitted to the driving voltage generators 420, 422, 424, and 426 within the conjunction regions CONJ through main word-lines.

The driving voltage generators 420, 422, 424, and 426 may generate driving signals PXID<i> and PXIB<i> for driving a word-line in response to the pre-decoding signals PXI<0>, PXI<1>, PXI<2>, PXI<3>, etc.

As the integration and speed of a semiconductor memory device become higher, a level of a high voltage for driving a word line may have an influence on the reliability of the semiconductor memory device. To improve the reliability of the semiconductor memory device, it may be beneficial to decrease the level of the high voltage and to inhibit/prevent a decrease in a high-voltage level due to a leakage current or the like at the same time. Accordingly, the driving voltage generators 420, 422, 424, and 426 may include a pull-up driver for the purpose of supplying the high voltage to a selected word line. In general, the pull-up driver may be implemented with a p-channel metal-oxide semiconductor (PMOS) transistor.

The sub-word line drivers 430, 440, 460, and 470 may activate or precharge a selected word-line in response to the word line enable signals NWEI<n> and the driving signals PXID<i> and PXIB<i>. In the case where a memory cell MC1 is selected, the word-line enable signal NWEI<0> is activated, and the driving signals PXID<2> and PXIB<2> provided from the driving voltage generator 420 are activated. In this case, the sub word-line driver 430 may drive a word-line WL<1> with the high voltage being a level of the driving signal PXID<2>. The operation of the sub word-line driver 430 is identically applied to the remaining sub-word line drivers 440, 460, 470, 430*a*, 440*a*, 460*a* and 470*a*.

In particular, each of the sub-word line drivers 430, 440, 460, 470, 430*a*, 440*a*, 460*a* and 470*a* includes a respective keeping transistor (not shown). The keeping transistors may be n-channel metal-oxide semiconductor (NMOS) transistors.

The sub word-line drivers 430, 440, 460, 470, 430*a*, 440*a*, 460*a* and 470*a* may precharge a deactivated word-line with a negative voltage through the keeping transistor. For example, the sub word-line driver 430 may include a keeping transistor that precharges the word-line WL<1> with the negative voltage in response to the driving signal PXIB<2>. Likewise, the sub word-line driver 440 may include a keeping transistor that precharges a word-line WL<5> with the negative voltage in response to the driving signal PXIB<2>.

Two keeping transistors of the sub word line drivers 430 and 440 adjacent each other in the second direction D2, respectively, according to example embodiments may be merged to share a gate electrode and to include separate sources to which the negative voltage is provided. That is, a pattern of a common gate electrode of the adjacent sub word-line drivers 430 and 440 may be provided. For example, with regard to the two keeping transistors, an active pattern may be implemented to form separated drains respectively connected to word-lines and to form separated sources for supplying the negative voltage. In particular, a common gate electrode may be formed in the shape of a square, an octagon, a circle, or an ellipse.

The bit-line sense amplifier region 490 may access a memory cell through a bit-line pair BTL and BTLB of a selected column in response to a column address. Also, the bit-line sense amplifier region 490 may further include components for storing input data in a selected memory cell. The bit-line sense amplifier region 490 may rewrite data stored in a memory cell during a self-refresh mode. The bit-line sense amplifier region 490 may be connected with memory cells in an open bit-line structure.

The sub array block 492 may include a plurality of memory cells (e.g., MC0~MC7 as shown) that are connected with word-lines WL (e.g., WL<0>—WL<7> as shown) and bit-lines BTL, and are arranged in a row direction (the first direction D1) and a column direction (the second direction D2). Each of the memory cells may include a cell capacitor and an access transistor. In each memory cell, a gate of the access transistor is connected to any one of the word-lines WL arranged in the row direction. A first end of the access transistor is connected to a bit-line BTL or a complementary bit-line BLB extending in the column direction. A second end of the access transistor may be connected to the cell capacitor.

Figure 7:
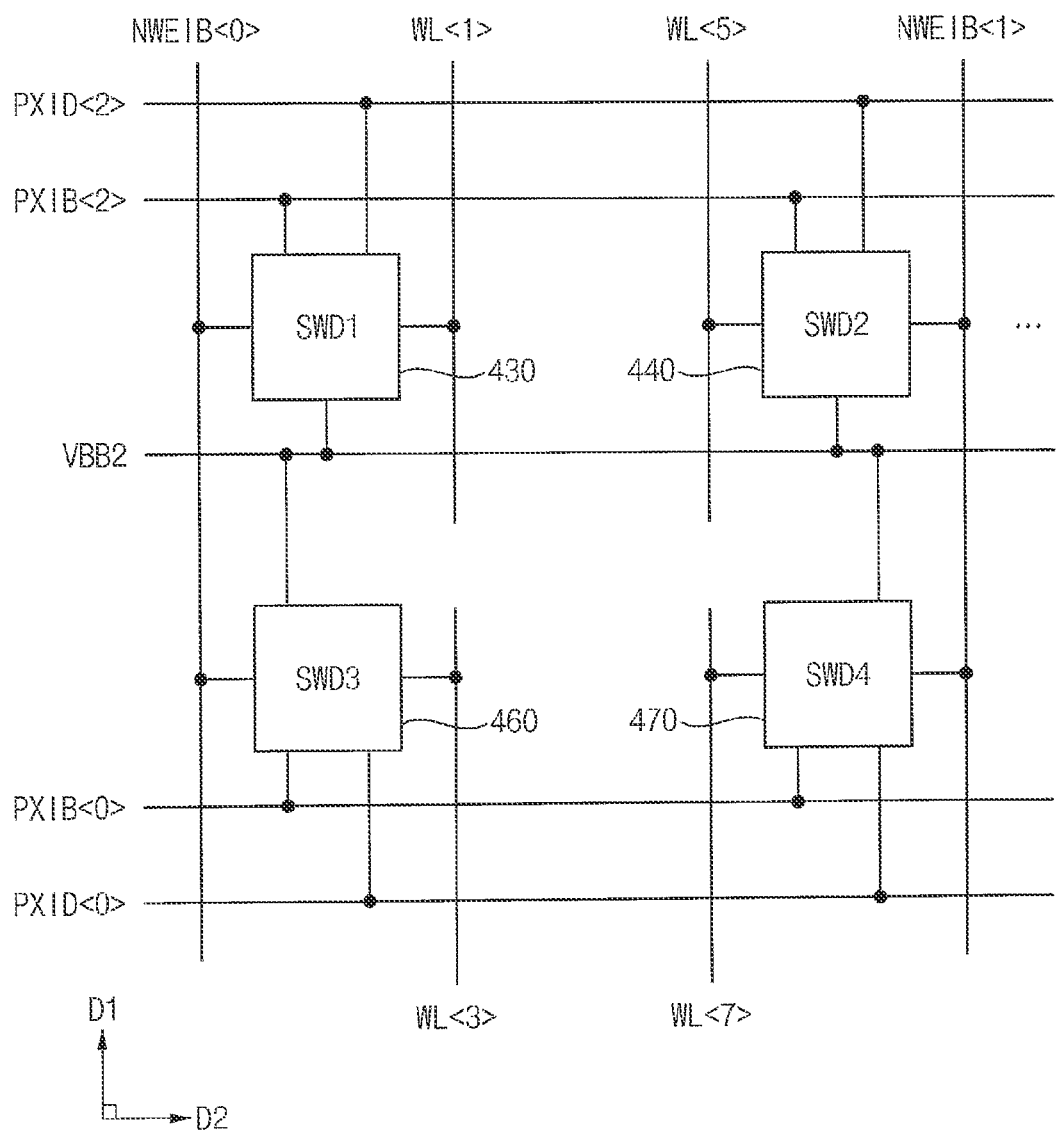
FIG. 7 illustrates a block diagram of adjacent sub word-line drivers in FIG. 6 according to embodiments of the inventive concepts.

FIG. 7 illustrates a block diagram of adjacent sub word-line drivers in FIG. 6 according to embodiments of the inventive concepts.

Referring to FIG. 7, the sub word-line drivers 430 and 440 that drive the word-lines WL<1> and WL<5> and are adjacent to each other, and the sub word-line drivers 460 and 470 that drive the word-lines WL<3> and WL<7> and are adjacent to each other are illustrated in FIG. 7.

The sub word-line drivers 430 and 440 may be adjacent to each other in the second direction D2, and the sub word-line drivers 460 and 470 may be adjacent to each other in the second direction D2.

All the sub word-line drivers 430 and 440 may be provided with the driving signals PXID<2> and PXIB<2>. The sub word-line driver 430 may be activated in response to the word line enable signal NWEIB<0>, and the sub word-line driver 440 may be activated in response to the word line enable signal NWEIB<1>.

If the word-line enable signal NWEIB<0> is activated to a low level "L", the sub-word line driver 430 provides the word-line WL<1> with the high voltage provided through the driving signal PXID<2>. Moreover, if the word-line enable signal NWEIB<0> of a high level is provided, the sub-word line driver 430 may block the driving signal PXID<2> and may precharge the word-line WL<1>, which may be an inactive word-line, with the negative voltage VBB2.

Likewise, if the word-line enable signal NWEIB<1> of the low level is provided, the sub-word line driver 440 provides the word-line WL<5> with the high voltage provided through the driving signal PXID<2>. If the word-line enable signal NWEIB<1> of the high level is provided, the sub word-line driver 440 may block the driving signal PXID<2> and may precharge the word-line WL<5> with the negative voltage VBB2.

All the sub word-line drivers 460 and 470 may be provided with the driving signals PXID<0> and PXIB<0>. The sub word-line driver 460 may be activated in response to the word line enable signal NWEIB<0>, and the sub word-line driver 470 may be activated in response to the word line enable signal NWEIB<1>.

If the word-line enable signal NWEIB<0> is activated to a low level "L", the sub-word line driver 440 provides the word-line WL<3> with the high voltage provided through the driving signal PXID<0>. Moreover, if the word-line enable signal NWEIB<0> of a high level is provided, the sub-word line driver 460 may block the driving signal PXID<0> and may precharge the word-line WL<3>, which may be an inactive word-line, with the negative voltage VBB2.

Likewise, if the word-line enable signal NWEIB<1> of the low level is provided, the sub-word line driver 470 provides the word-line WL<7> with the high voltage provided through the driving signal PXID<0>. If the word-line enable signal NWEIB<1> of the high level is provided, the sub word-line driver 470 may block the driving signal PXID<0> and may precharge the word-line WL<7> with the negative voltage VBB2.

The sub word-line drivers 430 and 440 may include keeping transistors for maintaining the word-lines WL<1> and WL<5> at the negative voltage VBB2 after the precharge operation. The keeping transistors may fix/couple the word-lines WL<1> and WL<5> to a level of the negative voltage VBB2 in response to the driving signal PXIB<2>. In this case, the word-lines WL<1> and WL<5> may maintain a stable voltage value regardless of a level change of the word-line enable signals NWEIB<0> and NWEIB<1> or noise (e.g., a noisy signal). The keeping transistors may also be characterized as fixing transistors.

The keeping transistors of the sub word-line drivers 430 and 440 may include separated source regions (electrodes) supplied with the negative voltage VBB2 and a common gate electrode to which the driving signal PXIB<2> is applied. The keeping transistors of the sub word-line drivers 430 and 440 may include two drain regions (electrodes) connected to the word-lines WL<1> and WL<5>, respectively.

Figure 8:
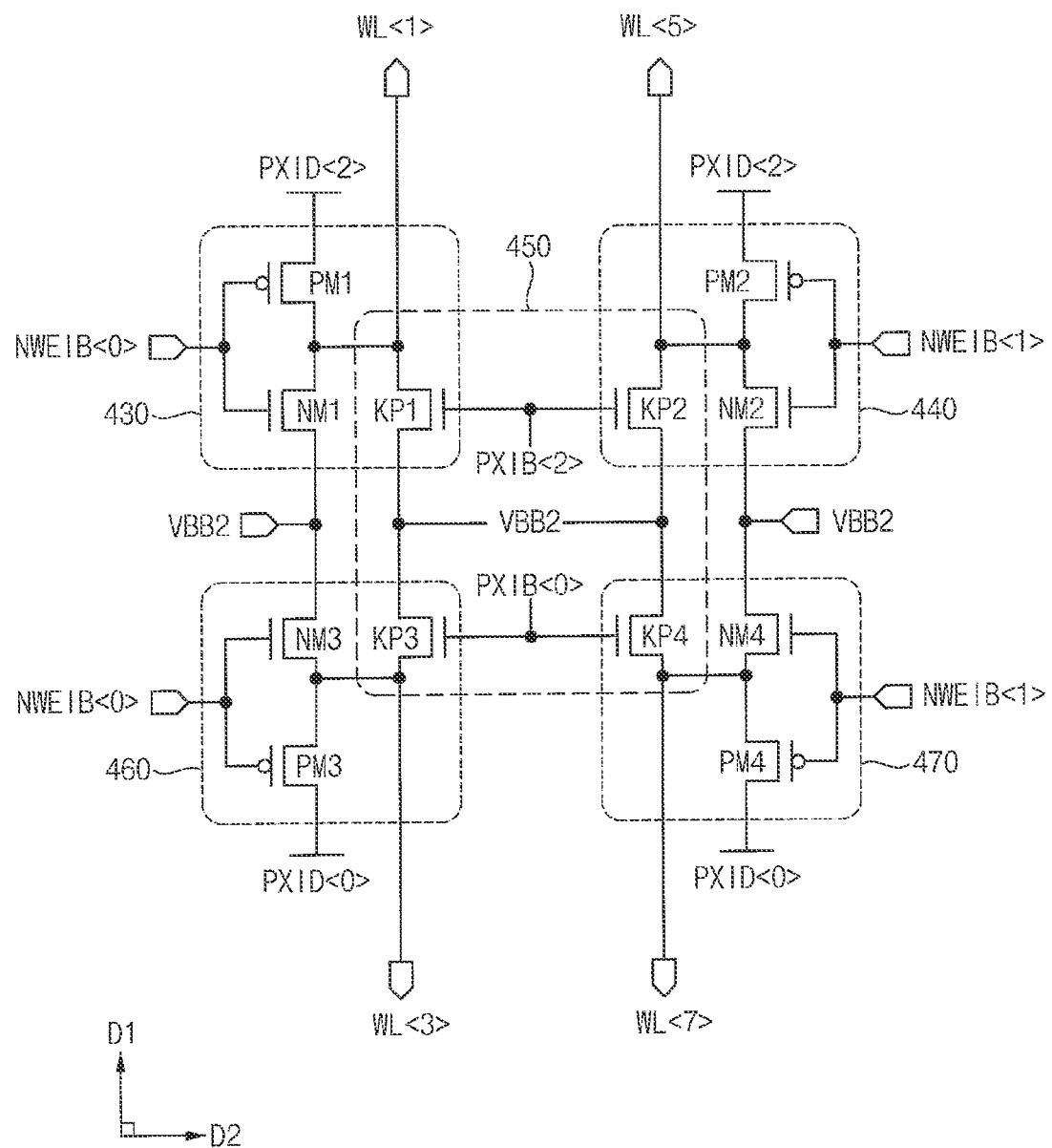
FIG. 8 illustrates a circuit diagram of a configuration of sub word-line drivers illustrated in FIG. 7.

FIG. 8 illustrates a circuit diagram of a configuration of sub word-line drivers illustrated in FIG. 7.

Referring to FIG. 8, the sub word-line drivers 430 and 440 may have a circuit structure for respectively driving the word-lines WL<1> and WL<5>, and the sub word-line drivers 460 and 470 may have a circuit structure for respectively driving the word-lines WL<3> and WL<7>.

The sub word-line driver 430 may be provided with the driving signals PXID<2> and PXIB<2> from the driving voltage generator 420 (refer to FIG. 6). The sub word-line driver 430 may be provided with the word-line enable signal NWEIB<0> from the row decoder 260*a*.

The sub word-line driver 430 includes a pull-up transistor PM1, a pull-down transistor NM1, and a keeping transistor KP1. The pull-up transistor PM1 pulls up the word-line WL<1> to a level of the driving signal PXID<2> in response to the word-line enable signal NWEIB<0>. In contrast, the pull-down transistor NM1 pulls down the word-line WL<1> to the negative voltage VBB2 in response to the word-line enable signal NWEIB<0>.

The keeping transistor KP1 allows the word-line WL<1> to be maintained at a level of the negative voltage VBB2 at a time point when the word-line WL<1> is deactivated. In some embodiments, the keeping transistor KP1 has a source (electrode) supplied with the negative voltage VBB2 and a drain (electrode) connected to the word-line WL<1>, and is turned on or off in response to the driving signal PXIB<2> that is complementary to the driving signal PXID<2>.

The sub word-line driver 440 may be provided with the driving signals PXID<2> and PXIB<2> from the driving voltage generator 420. The sub word-line driver 440 is provided with the word-line enable signal NWEIB<1> from the row decoder 260*a*.

The sub word-line driver 440 may include a pull-up transistor PM2, a pull-down transistor NM2, and a keeping transistor KP2. The pull-up transistor PM2 pulls up the word-line WL<5> to a level of the driving signal PXID<2> in response to the word-line enable signal NWEIB<1>. In contrast, the pull-down transistor NM2 pulls down the word-line WL<5> to the negative voltage VBB2 in response to the word-line enable signal NWEIB<1>.

The keeping transistor KP2 allows the word-line WL<5> to be maintained at a level of the negative voltage VBB2 at a time point when the word-line WL<5> is deactivated. To this end, the keeping transistor KP2 has a source supplied with the negative voltage VBB2 and a drain connected to the word-line WL<5>, and is turned on or off in response to the driving signal PXIB<2> that is complementary to the driving signal PXID<2>.

The keeping transistor KP1 of the sub word-line driver 430 and the keeping transistor KP2 of the sub word-line driver 440 may be provided with the same gate voltage corresponding to a voltage of the driving signal PXIB<2>. The same negative voltage VBB2 may be provided to the sources of the keeping transistors KP1 and KP2.

The sub word-line driver 460 may be provided with the driving signals PXID<0> and PXIB<0> from the driving voltage generator 420. The sub word-line driver 460 may be provided with the word-line enable signal NWEIB<0> from the row decoder 260*a*.

The sub word-line driver 460 includes a pull-up transistor PM3, a pull-down transistor NM3, and a keeping transistor KP3. The pull-up transistor PM3 pulls up the word-line WL<3> to a level of the driving signal PXID<0> in response to the word-line enable signal NWEIB<0>. In contrast, the pull-down transistor NM3 pulls down the word-line WL<3> to the negative voltage VBB2 in response to the word-line enable signal NWEIB<0>.

The keeping transistor KP3 allows the word-line WL<3> to be maintained at a level of the negative voltage VBB2 at a time point when the word-line WL<3> is deactivated. In some embodiments, the keeping transistor KP3 has a source supplied with the negative voltage VBB2 and a drain connected to the word-line WL<3>, and is turned on or off in response to the driving signal PXIB<0> that is complementary to the driving signal PXID<0>.

The sub word-line driver 470 may be provided with the driving signals PXID<0> and PXIB<0> from the driving voltage generator 420. The sub word-line driver 470 is provided with the word-line enable signal NWEIB<1> from the row decoder 260*a*.

The sub word-line driver 470 may include a pull-up transistor PM4, a pull-down transistor NM4, and a keeping transistor KP4. The pull-up transistor PM4 pulls up the word-line WL<7> to a level of the driving signal PXID<0> in response to the word-line enable signal NWEIB<1>. In contrast, the pull-down transistor NM4 pulls down the word-line WL<7> to the negative voltage VBB2 in response to the word-line enable signal NWEIB<1>.

The keeping transistor KP4 allows the word-line WL<7> to be maintained at a level of the negative voltage VBB2 at a time point when the word-line WL<7> is deactivated. To this end, the keeping transistor KP4 has a source supplied with the negative voltage VBB2 and a drain connected to the word-line WL<7>, and is turned on or off in response to the driving signal PXIB<0> that is complementary to the driving signal PXID<0>.

The keeping transistor KP3 of the sub word-line driver 460 and the keeping transistor KP4 of the sub word-line driver 470 may be provided with the same gate voltage corresponding to a voltage of the driving signal PXIB<0>. The same negative voltage VBB2 may be provided to the sources of the keeping transistors KP3 and KP4.

The keeping transistors KP1, KP2, KP3 and KP4 may be provided in an NMOS region 450.

In FIG. 8, the (a first) sub word-line driver 430 and the (a second) sub word-line driver 440 may be referred to as a sub word-line driver circuit, and the (a third) sub word-line driver 460 and the (a fourth) sub word-line driver 470 may be referred to as another sub word-line driver circuit.

Figure 9:
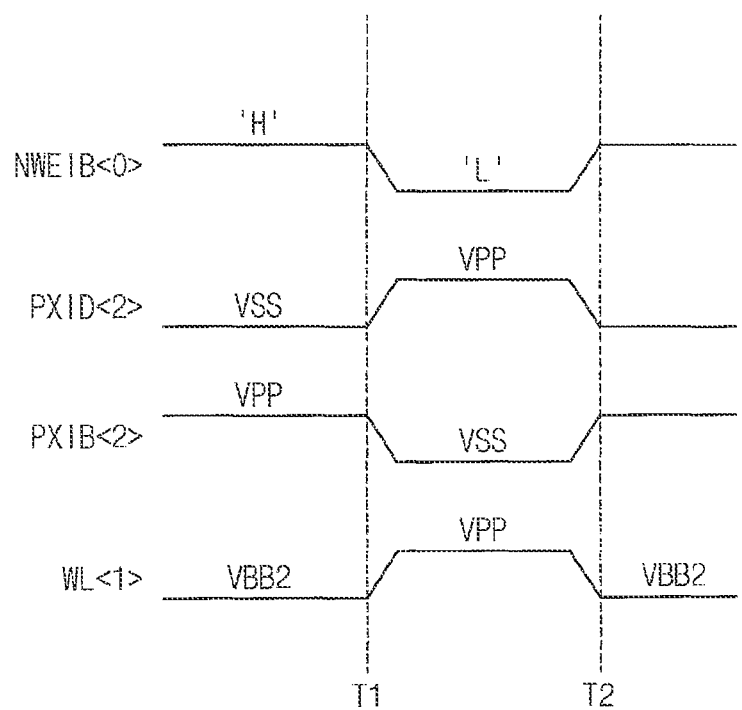
FIG. 9 illustrates a waveform diagram explanatory of an operation of a first sub word-line driver of FIG. 8.

FIG. 9 illustrates a waveform diagram explanatory of an operation of a first sub word-line driver of FIG. 8.

Referring to FIG. 9, the first sub word-line driver 430 drives the word-line WL<1> with the high voltage VPP or the negative voltage VBB2 in response to the word-line enable signal NWEIB<0>.

The first sub word-line driver 430 pulls up or pulls down a voltage of the word-line WL<1> in response to the word-line enable signal NWEIB<0>. It is assumed that the word-line enable signal NWEIB<0> is at a high level "H" corresponding to an inactive state before a time point T1. In this case, it is assumed that the driving signal PXID<2> is at the low level "L" and the driving signal PXIB<2> is at the high level "H". The word-line WL<1> may be maintained at the negative voltage VBB2 while the word-line enable signal NWEIB<0> is in an inactive state.

At the time point T1, the word-line enable signal NWEIB<0> is activated to the low level. Also, the driving signal PXID<2> may transition to a level of the high voltage VPP, and the driving signal PXIB<2> may transition to the low level (e.g., VSS). As the word-line enable signal NWEIB<0> transitions to the low level, the pull-up transistor PM1 is turned on, and the pull-down transistor NM1 is turned off. Also, as the driving signal PXIB<2> is maintained at the low level, the keeping transistor KP1 is turned off.

In this case, the word-line WL<1> and the source of the keeping transistor KP1 are electrically separated. The word-line WL<1> and the source of the pull-up transistor PM1 are connected. As such, the driving signal PXID<2> is supplied to the word-line WL<1>. Preferably, the driving signal PXID<2> may have a level of the high voltage VPP. A voltage of the word-line WL<1> may increase to the level of the high voltage VPP through a pull-up operation of the pull-up transistor PM1.

At a time point T2, the word-line enable signal NWEIB<0> is deactivated to the high level. In addition, the driving signal PXID<2> may transition to a ground (VSS) level, and the driving signal PXIB<2> may transition to the high level. As the word-line enable signal NWEIB<0> transitions to the high level, the pull-up transistor PM1 is turned off, and the pull-down transistor NM1 is turned on. The keeping transistor KP1 is turned on according to the transition of the driving signal PXIB<2> to the high level.

In this case, the word-line WL<1> and the source of the keeping transistor KP1 are electrically connected, and the word-line WL<1> and the source of the pull-up transistor PM1 are electrically separated. As such, a voltage of the word-line WL<1> may decrease to a level of the negative voltage VBB2 by the pull-down transistor NM1 and the keeping transistor KP1.

Figure 10:
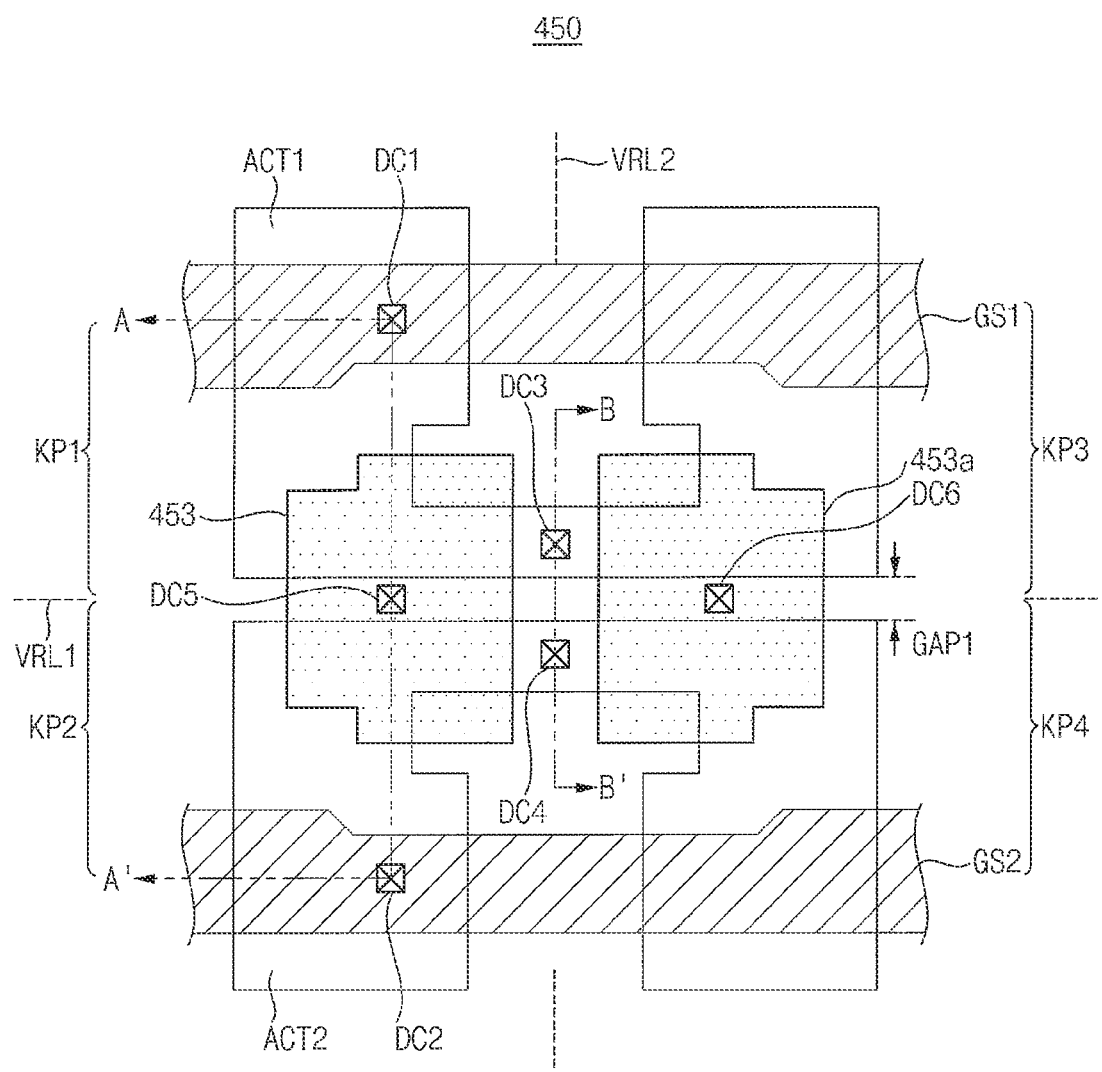
FIG. 10 illustrates a view of an example of a layout of an NMOS region in FIG. 8 according to embodiments of the inventive concepts.

FIG. 10 illustrates a view of an example of a layout of an NMOS region in FIG. 8 according to embodiments of the inventive concepts.

A layout for forming separated source regions of the first keeping transistor KP1 and the second keeping transistor KP2 of adjacent sub word-line drivers 430 and 440 in the NMOS region 450 is illustrated in FIG. 10.

In addition, a layout for forming separated source regions of the third keeping transistor KP3 and the fourth keeping transistor KP4 of adjacent sub word-line drivers 460 and 470 in the NMOS region 450 is also illustrated in FIG. 10

First, a first active pattern ACT1 and a second active pattern ACT2 may be formed in a substrate (not illustrated). The first active pattern ACT1 may extend in the first direction D1 and the second direction D2 crossing the first direction D1.

The second active pattern ACT2 may be spaced apart from the first active pattern ACT1 in the second direction D2 by a first gap GAP1 and may extend in the first direction D1 and the second direction D2.

The first active pattern ACT1 and the second active pattern ACT2 may be symmetric to each other with respect to a virtual reference line VRL1 extending in the first direction D1. In other words, the first active pattern ACT1 and the second active pattern ACT2 are symmetric to each other along the first gap GAP1.

A drain (region or terminal), a source (region or terminal) and a channel of the first keeping transistor KP1 may be formed in the first active pattern ACT1. In addition, a drain, a source and a channel of the third keeping transistor KP3 may be formed in the first active pattern ACT1.

A drain, a source and a channel of the second keeping transistor KP2 may be formed in the second active pattern ACT2. In addition, a drain, a source and a channel of the fourth keeping transistor KP4 may be formed in the second active pattern ACT2.

The source of the first keeping transistor KP1 may be formed at a portion of the first active pattern ACT1 at which the first active pattern ACT1 and a third direct contact DC3 are connected. The source of the second keeping transistor KP2 may be formed at a portion of the second active pattern ACT2 at which the second active pattern ACT2 and a fourth direct contact DC4 are connected.

The third direct contact DC3 may be formed on the first active pattern ACT1 such that the third direct contact DC3 is not overlapped with a first gate pattern 453 and a second gate pattern 453a.

The fourth direct contact DC4 may be formed on the second active pattern ACT2 such that the fourth direct contact DC4 is not overlapped with a first gate pattern 453 and a second gate pattern 453a.

The source of the third keeping transistor KP3 may be formed at a portion of the first active pattern ACT1 at which the first active pattern ACT1 and the third direct contact DC3 are connected. The source of the fourth keeping transistor KP4 may be formed at a portion of the second active pattern ACT2 at which the second active pattern ACT2 and the fourth direct contact DC4 are connected.

A region of the first keeping transistor KP1 in which the first active pattern ACT1 is connected with a gate structure GS1 through a first direct contact DC1 forms the drain of the first keeping transistor KP1. The gate structure GS1 at the first keeping transistor KP1 may correspond to the word-line <WL1>.

A region of the second keeping transistor KP2 in which the second active pattern ACT2 is connected with a gate structure GS2 through a second direct contact DC2 forms the drain of the second keeping transistor KP2. The gate structure GS2 at the second keeping transistor KP2 may correspond to the word-line <WL5>.

The gate pattern 453 extending in the second direction D2 is formed on the first active pattern ACT1 and the second active pattern ACT2 such that the gate pattern 453 is partially overlapped with the first active pattern ACT1 and the second active pattern ACT2. The gate pattern 453a extending in the second direction D2 is formed on the first active pattern ACT1 and the second active pattern ACT2 such that the gate pattern 453a is partially overlapped with the first active pattern ACT1 and the second active pattern ACT2.

The gate pattern 453 and the gate pattern 453a may be symmetric to each other with respect to a virtual reference line VRL2 extending in the second direction D2. The first active pattern ACT1 and the second active pattern ACT2 may be separated from each other by a device isolation region (not illustrated).

The gate pattern 453 and the gate pattern 453a may be formed in a shape of a convex polygon.

In addition, a gate insulating layer (not shown) may be formed between the gate pattern 453 and the first active pattern ACT1 and the second active pattern ACT2, and a gate insulating layer (not shown) may be formed between the gate pattern 453a and the first active pattern ACT1 and the second active pattern ACT2.

The driving signal PXIB<2> may be provided to the gate pattern 453 by using a fifth direct contact DC5. The driving signal PXIB<0> may be provided to the gate pattern 453a by using a sixth direct contact DC6.

Figure 11:
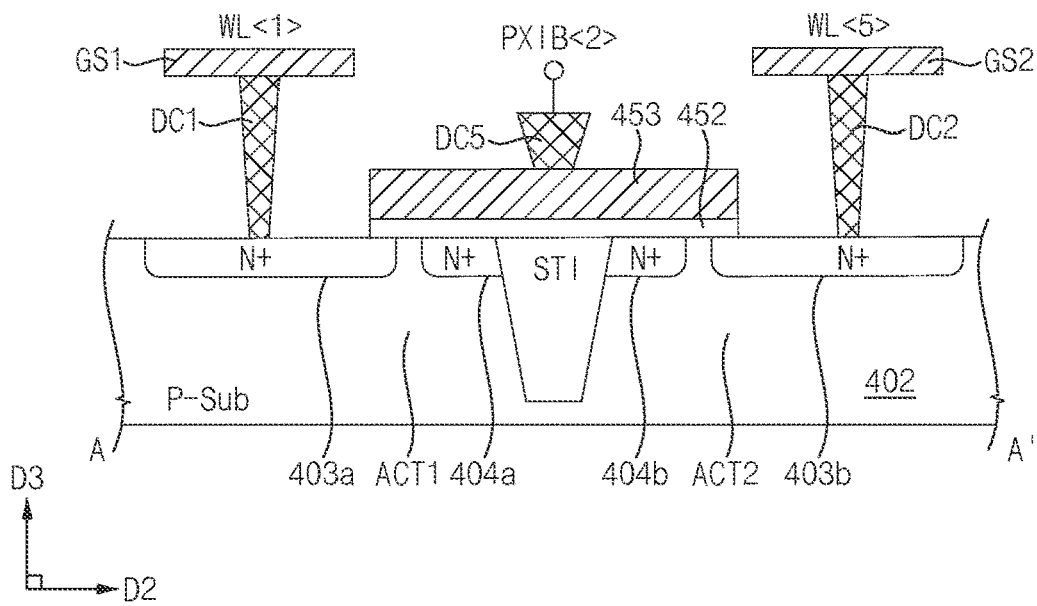
FIG. 11 illustrates a cross-sectional view of the NMOS region taken along a line A-A' in FIG. 10.

FIG. 11 illustrates a cross-sectional view of the NMOS region taken along a line A-A' in FIG. 10.

A P-type substrate 402 for forming the NMOS region 450, the gate pattern 453, and the word-lines WL<1> and WL<5> are illustrated in FIG. 11 in the second direction D2 and a third direction D3.

Referring to FIG. 11, the P-type substrate (P-Sub) 402 may be separated into the first active pattern ACT1 and the second active pattern ACT2 by a device isolation region STI.

N+ doping regions 403a and 403b that act as drains of the first and second keeping transistors KP1 and KP2 are formed in the P-type substrate 402, and N+ doping regions 404a and 404b that act as sources of the first and second keeping transistors KP1 and KP2 are formed in the P-type substrate 402. A gate insulating layer 452 and the gate pattern 453 acting as the gate electrode of the first and second keeping transistors KP1 and KP2 are sequentially stacked on the resultant structure.

The first direct contact DC1 for connecting the word-line WL<1> (i.e., GS1) and the N+ doping area 403a may be formed on the N+ doping area 403a. The second direct contact DC2 for connecting the word-line WL<5> (i.e., GS2) and the N+ doping area 403b may be formed on the N+ doping area 403b.

Because the N+ doping regions 404a and 404b that act as sources of the first and second keeping transistors KP1 and KP2 are separated by the device isolation region STI, interference between word-lines due to short-circuit phenomenon under the gate pattern 453 may be prevented and a gap between the N+ doping regions 404a and 404b in the second direction D2 may be reduced when a structure of FIG. 11 is compared with a structure in which N+ doping regions that act as sources of the first and second keeping transistors KP1 and KP2 are merged.

Figure 12:
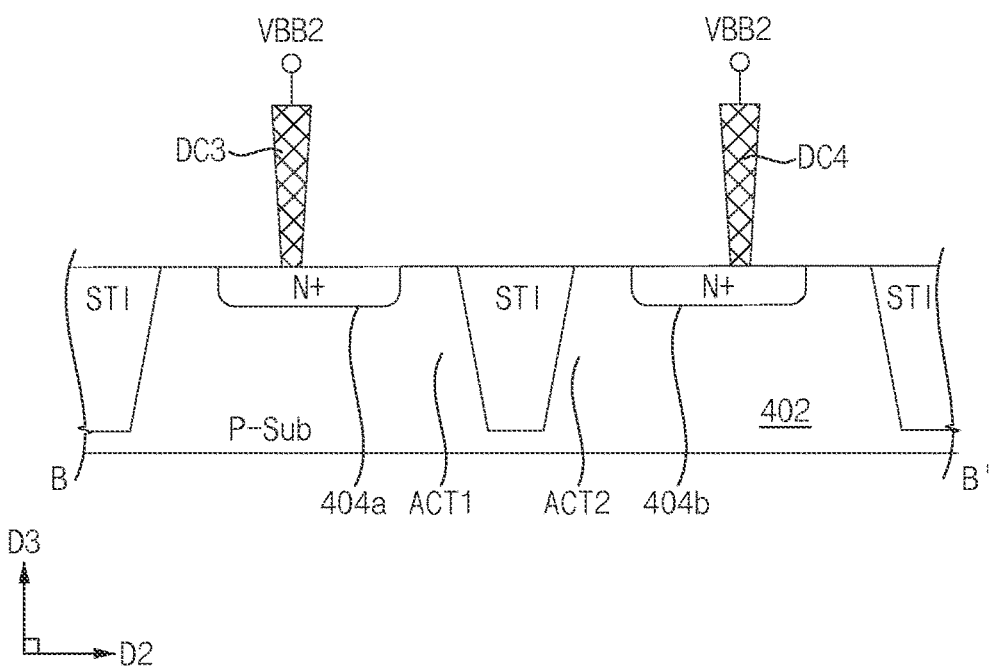
FIG. 12 illustrates a cross-sectional view of the NMOS region taken along a line B-B' in FIG. 10.

FIG. 12 illustrates a cross-sectional view of the NMOS region taken along a line B-B' in FIG. 10.

A P-type substrate 402 for forming the NMOS region 450, the third direct contact DC3 and the fourth direct contact DC4 are illustrated in FIG. 12 in the second direction D2 and the third direction D3.

Referring to FIG. 12, the P-type substrate (P-Sub) 402 may be separated into the first active pattern ACT1 and the second active pattern ACT2 by the device isolation region STI.

N+ doping region 404a that acts as a source of the first keeping transistor KP1 is formed in the first active pattern ACT1, and N+ doping region 404b that acts as a source of the second keeping transistor KP2 is formed in the second active pattern ACT2.

The negative voltage VBB2 is supplied to the source of the first keeping transistor KP1 through the third direct contact DC3 and the negative voltage VBB2 is supplied to the source of the second keeping transistor KP2 through the fourth direct contact DC4.

Each of the third direct contact DC3 and the fourth direct contact DC4 may have a shape of a small square or a dot instead of having a shape of bar.

Figure 13:
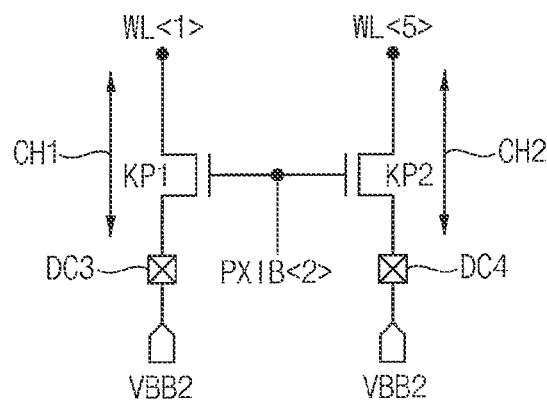
FIG. 13 illustrates a view schematically showing a channel shape of a keeping transistor according to embodiments of the inventive concepts.

FIG. 13 illustrates a view schematically showing a channel shape of a keeping transistor according to embodiments of the inventive concepts.

In FIG. 13, the first keeping transistor KP1 and the second keeping transistor KP2 are adjacent to each other in the second direction D2 in the NMOS region 450 shown in FIG. 10.

Referring to FIG. 13, a channel CH1 of the first keeping transistor KP1 and a channel CH2 of the second keeping transistor KP2 may be formed separately under the gate pattern 453 when the driving signal PXIB<2> having a high voltage VPP is applied to the gate pattern 453 and the negative voltage VBB2 is supplied to the third and fourth direct contacts DC3 and DC4. The source of the first keeping transistor KP1 and the source of the second keeping transistor KP2 may be separated from each other by the device isolation region STI.

Figure 14:
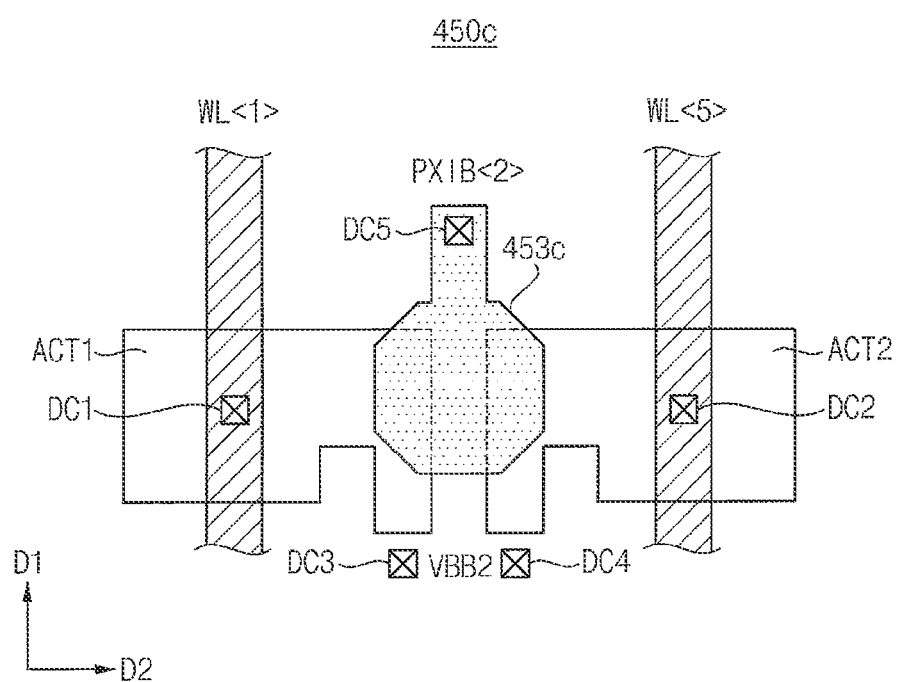
FIG. 14 illustrates a view of another example of a layout of an NMOS region in FIG. 8 according to embodiments of the inventive concepts.

FIG. 14 illustrates a view of another example of a layout of an NMOS region in FIG. 8 according to embodiments of the inventive concepts.

A layout for forming separated source region of the first and second keeping transistors of sub word-line drivers adjacent in the second direction D2 in an NMOS region 450c is illustrated in FIG. 14.

Referring to FIG. 14, a gate pattern 453c may be formed in the shape of an octagon. The first active pattern ACT1 and the second active pattern ACT2 may be symmetric to each other with respect to the first direction D1 and may be spaced apart from each other by the device isolation region in the second direction D2.

The gate pattern 453c may be variously changed according to various conditions for implementing the sub word-line driver. In particular, it should be well understood that a shape of the gate pattern may be implemented in various shapes of polygons in consideration of a distance (or cell pitch) between the word-lines WL<1> and WL<5>, and the arrangement/relationship between the word-lines WL<1> and WL<5> and a main word-line. For example, the gate pattern 453c may be formed in the shape of a regular octagon in which segments have the same length or may be formed in the shape of an octagon in which lengths of neighboring segments are different from each other.

Figure 15:
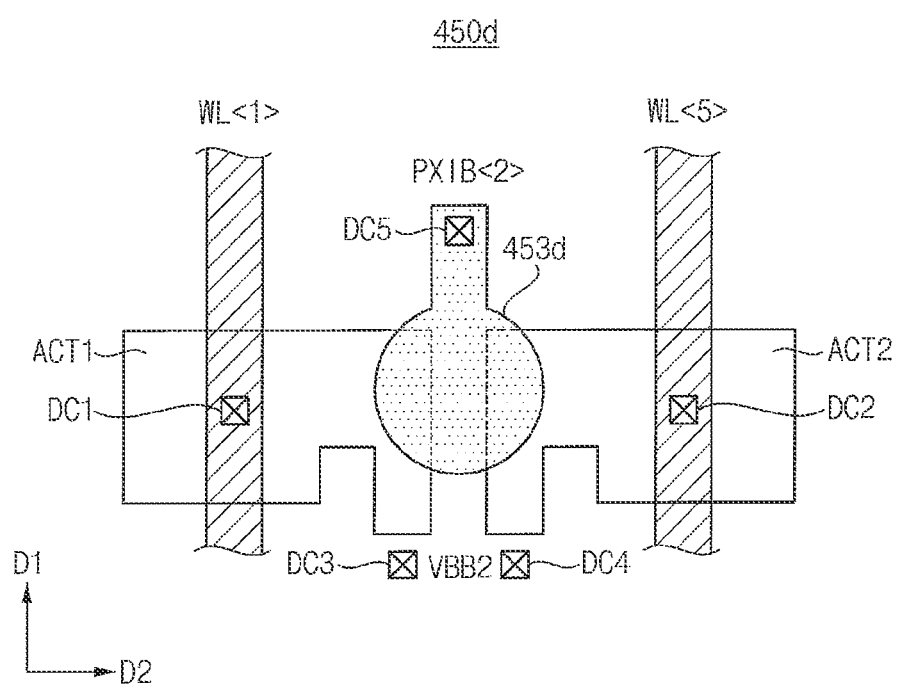
FIG. 15 illustrates a view of another example of a layout of an NMOS region in FIG. 8 according to embodiments of the inventive concepts.

FIG. 15 illustrates a view of another example of a layout of an NMOS region in FIG. 8 according to embodiments of the inventive concepts.

A layout for forming separated source region of the first and second keeping transistors KP1 and KP2 of sub word-line drivers adjacent in the second direction D2 in an NMOS region 450*d* is illustrated in FIG. 15.

Referring to FIG. 15, a gate pattern 453*d* may be formed in the shape of a circle. The first active pattern ACT1 and the second active pattern ACT2 may be symmetric to each other with respect to the first direction D1 and may be spaced apart from each other by the device isolation region in the second direction D2.

The gate pattern 453*d* may be variously changed according to various conditions for implementing the sub word-line driver. In particular, it should be well understood that a shape of the gate pattern may be implemented in various shapes of arcs and/or polygons in consideration of a distance (or cell pitch) between the word-lines WL<1> and WL<5>, and the (arrangement) relationship between the word-lines WL<1> and WL<5> and a main word-line. For example, the gate pattern 453*d* may be formed in the shape of a circle or may be formed in the shape of an ellipse in which a radius in a specific direction is relatively long.

Figure 16:
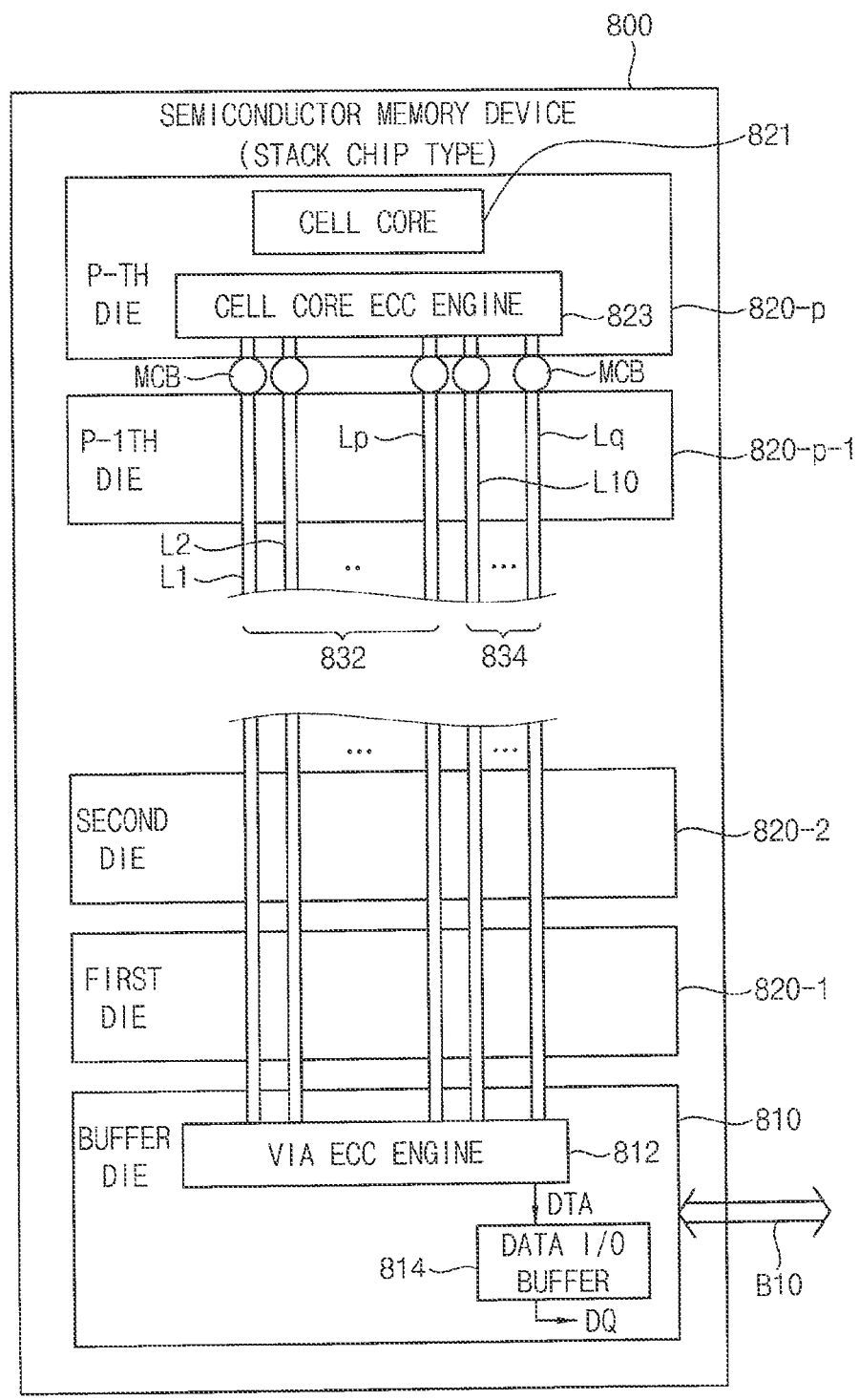
FIG. 16 illustrates a block diagram of a semiconductor memory device according to embodiments of the inventive concepts.

FIG. 16 illustrates a block diagram of a semiconductor memory device according to example embodiments.

Referring to FIG. 16, a semiconductor memory device 800 may include at least one buffer die 810 and a plurality of memory dies 820-1 to 820-*p* (p is a natural number equal to or greater than three) providing a soft error analyzing and correcting function in a stacked chip structure.

The plurality of memory dies 820-1 to 820-*p* are stacked on the buffer die 810 and convey data through a plurality of through silicon via (TSV) lines.

At least one of the memory dies 820-1 to 820-*p* may include a cell core 821 to store data and a cell core ECC engine 823 which generates transmission parity bits (i.e., transmission parity data) based on transmission data to be sent to the at least one buffer die 810. The cell core 821 may include a plurality of memory cells having DRAM cell structure. The cell core 821 may include sub word-line drivers for driving word-lines coupled to the plurality of memory cells.

The sub word-line drivers may include a first sub word-line driver including a first keeping transistor for supplying a negative voltage to a first word-line extending in a first direction in response to a driving signal, and a second sub word-line driver including a second keeping transistor for supplying the negative voltage to a second word-line extending in the first direction in response to the driving signal.

The first keeping transistor and the second keeping transistor includes a first active pattern that extends in a second direction crossing the first direction and is connected with the first word-line through a first direct contact, a second active pattern that extends in the second direction and is spaced apart from the first active pattern in the second direction by a first gap, and a gate pattern on a portion of the first active pattern and the second active pattern such that the gate pattern is partially overlapped with the first active pattern and the second active pattern.

Therefore, the first keeping transistor and the second keeping transistor share the gate pattern but include respective source regions separated by a device isolation region. Accordingly, interference between word-lines due to short-circuit phenomenon under the gate pattern may be prevented and a gap between the source region in the second direction may be reduced compared to a structure in which source regions of the first and second keeping transistors are merged.

The buffer die 810 may include a via ECC engine 812 which corrects a transmission error using the transmission parity bits when a transmission error is detected from the transmission data received through the TSV lines, and generates error-corrected data.

The buffer die 810 may further include a data I/O buffer 814. The data I/O buffer 814 may generate the data signal DQ by sampling the data DTA from the via ECC engine 812 and may output the data signal DQ to an outside.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-*p* before the transmission data is sent.

A data TSV line group 832 which is formed at one memory die 820-*p* may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-*p*.

The semiconductor memory device 800 may have a three-dimensional (3D) chip structure or a 2.5D chip structure to communicate with the host (not shown) through a data bus B10. The buffer die 810 may be connected with the memory controller through the data bus B10.

According to example embodiments, as illustrated in FIG. 16, the cell core ECC engine 823 may be included in the memory die, and the via ECC engine 812 may be included in the buffer die 810. Accordingly, it may be possible to detect and correct soft data fail. The soft data fail may include a transmission error which is generated due to noise when data is transmitted through TSV lines.

Figure 17:
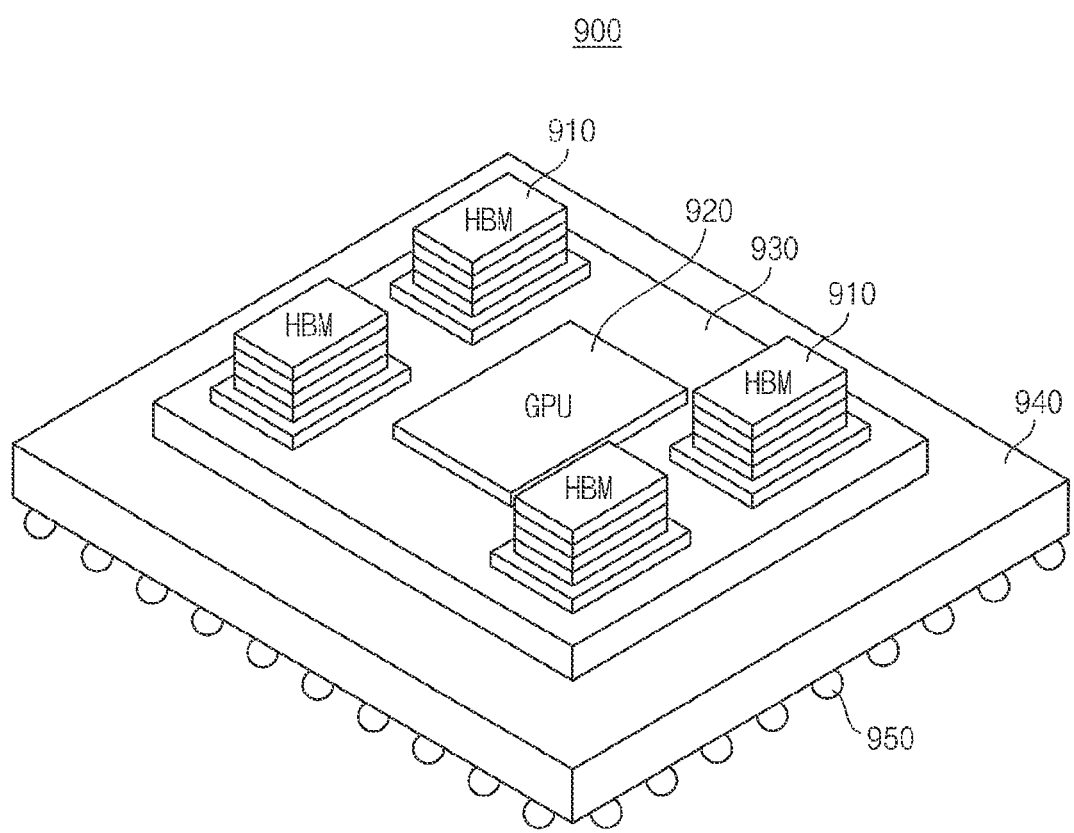
FIG. 17 illustrates a configuration diagram of a semiconductor package including the stacked memory device according to embodiments of the inventive concepts.

FIG. 17 illustrates a configuration diagram of a semiconductor package including the stacked memory device according to embodiments of the inventive concepts.

Referring to FIG. 17, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940. Solder balls 950 may be provided on the underside of package substrate 940. The GPU 920 may correspond to a semiconductor device which may perform a memory control function, and for example, the GPU 920 may be implemented as an application processor (AP). The GPU 920 may include a memory controller having a scheduler.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies may include a cell core and the cell core may include adjacent sub word-line drivers having separated source regions.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

The inventive concepts may be applied to systems using semiconductor memory devices that employ volatile memory cells and sub word-line drivers for driving word-lines. For example, the inventive concepts may be applied to systems such as smart phones, navigation systems, notebook computers, desk top computers and game consoles that use semiconductor memory devices as working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the present inventive concepts as defined in the claims.

What is claimed is:

1. A semiconductor memory device comprising:
    a first sub word-line driver including a first transistor configured to supply a negative voltage to a first word-line extending in a first direction in response to a driving signal; and
    a second sub word-line driver including a second transistor configured to supply the negative voltage to a second word-line extending in the first direction in response to the driving signal,
    wherein the first transistor and the second transistor comprise:
    a first active pattern that extends in a second direction crossing the first direction and that is connected with the first word-line through a first direct contact;
    a second active pattern that extends in the second direction, that is spaced apart from the first active pattern in the second direction by a first gap and that is connected with the second word-line through a second direct contact; and
    a gate pattern on a portion of the first active pattern and a portion of the second active pattern, the gate pattern partially overlapping the first active pattern and the second active pattern,
    wherein the first active pattern is connected with a third direct contact that does not overlap the gate pattern and that supplies the negative voltage, and
    wherein the second active pattern is connected with a fourth direct contact that does not overlap the gate pattern and that supplies the negative voltage.

2. The semiconductor memory device of claim 1, wherein the first active pattern and the second active pattern are isolated from each other by a device isolation region.

3. The semiconductor memory device of claim 1, wherein the first active pattern and the second active pattern are symmetric to each other along the first gap.

4. The semiconductor memory device of claim 1, wherein the gate pattern has a shape of a convex polygon or a circle.

5. The semiconductor memory device of claim 1, wherein the first transistor comprises a first n-channel metal-oxide semiconductor (NMOS) transistor and the second transistor comprises a second NMOS transistor.

6. The semiconductor memory device of claim 1, wherein the first sub word-line driver further comprises:

a first pull-up transistor configured to pull up the first word-line to a higher voltage than the negative voltage based on a first word-line enable signal; and
a first pull-down transistor configured to pull down the first word-line to the negative voltage based on the first word-line enable signal.

7. The semiconductor memory device of claim 6, wherein the second sub word-line driver further comprises:
    a second pull-up transistor configured to pull up the second word-line to the higher voltage than the negative voltage based on a second word-line enable signal; and
    a second pull-down transistor configured to pull down the second word-line to the negative voltage based on the second word-line enable signal.

8. The semiconductor memory device of claim 1, wherein the first sub word-line driver and the second sub word-line driver are adjacent each other in the second direction.

9. The semiconductor memory device of claim 1, further comprising a fifth direct contact which is on the gate pattern and is configured to provide the driving signal to the gate pattern.

10. The semiconductor memory device of claim 1, further comprising a memory cell array including a plurality of volatile memory cells coupled to the first word-line and the second word-line.

11. A sub word-line driver circuit of a semiconductor memory device, the sub word-line driver circuit comprising:
    a first active pattern in a substrate, the first active pattern including a first drain region and a first source region of a first transistor configured to precharge a first word-line which is inactive and extends in a first direction with a negative voltage;
    a second active pattern in the substrate, the second active pattern including a second drain region and a second source region of a second transistor configured to precharge a second word-line which is inactive and extends in the first direction with the negative voltage; and
    a gate pattern on a portion of the first active pattern and on a portion of the second active pattern, the gate pattern partially overlapping the first active pattern and the second active pattern.

12. The sub word-line driver circuit of claim 11, wherein the first drain region, the first source region and the gate pattern configure the first transistor.

13. The semiconductor memory device of claim 12, further comprising a first direct contact on the first drain region, the first direct contact configured to connect the first drain region and the first word-line.

14. The sub word-line driver circuit of claim 11, wherein the second drain region, the second source region and the gate pattern configure the second transistor.

15. The sub word-line driver circuit of claim 14, further comprising a second direct contact on the second drain region, the second direct contact configured to connect the second drain region and the second word-line.

16. The sub word-line driver circuit of claim 11, wherein the first active pattern and the second active pattern are isolated from each other by a device isolation region, and
    wherein the sub word-line driver circuit further comprises:
    a first direct contact on the first drain region, the first direct contact configured to connect the first drain region and the first word-line;

a second direct contact on the second drain region, the second direct contact configured to connect the second drain region and the second word-line;

a third direct contact on the first active pattern, the third direct contact configured to not overlap the gate pattern and to supply the negative voltage; and a fourth direct contact on the second active pattern, the fourth direct contact configured to not overlap the gate pattern and to supply the negative voltage.

17. A semiconductor memory device comprising:

a first sub word-line driver configured to drive a first word-line extending in a first direction; and a second sub word-line driver configured to drive a second word-line extending in the first direction, wherein the first sub word-line driver includes a first transistor configured to precharge the first word-line with a negative voltage in response to a driving signal, wherein the second sub word-line driver includes a second transistor configured to precharge the second word-line with the negative voltage in response to the driving signal, wherein the first transistor and the second transistor comprise:

a first active pattern that extends in a second direction crossing the first direction and that is connected with the first word-line through a first direct contact;

a second active pattern that extends in the second direction, that is spaced apart from the first active pattern in the second direction by a first gap and that is connected with the second word-line through a second direct contact; and a gate pattern on a portion of the first active pattern and on a portion of the second active pattern, the gate pattern partially overlapping the first active pattern and the second active pattern.

18. The semiconductor memory device of claim 17, wherein the first active pattern is connected with a third direct contact that does not overlap the gate pattern and that supplies the negative voltage, wherein the second active pattern is connected with a fourth direct contact that does not overlap the gate pattern and that supplies the negative voltage, and wherein the first active pattern and the second active pattern are isolated from each other at the first gap by a device isolation region.

19. The semiconductor memory device of claim 17, wherein the first active pattern and the second active pattern are symmetric to each other along the first gap, and wherein the gate pattern has a shape of a convex polygon or a circle.

20. The semiconductor memory device of claim 17, wherein each of the first transistor and the second transistor comprises an n-channel metal-oxide semiconductor (NMOS) transistor.

* * * * *